(12) United States Patent
Grötsch et al.

(10) Patent No.: US 7,976,205 B2
(45) Date of Patent: Jul. 12, 2011

(54) LIGHT-EMITTING MODULE, PARTICULARLY FOR USE IN AN OPTICAL PROJECTION APPARATUS

(75) Inventors: Stefan Grötsch, Bad Abbach (DE); Sergey Kudaev, Jena (RU); Bryce Anton Moffat, Jena (DE); Peter Schreiber, Jena (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 406 days.

(21) Appl. No.: 12/065,017

(22) PCT Filed: Aug. 31, 2006

(86) PCT No.: PCT/DE2006/001522
§ 371 (c)(1),
(2), (4) Date: Jun. 5, 2008

(87) PCT Pub. No.: WO2007/025525
PCT Pub. Date: Mar. 8, 2007

(65) Prior Publication Data
US 2009/0129079 A1    May 21, 2009

(30) Foreign Application Priority Data

Aug. 31, 2005 (DE) .................... 10 2005 041 319
Nov. 17, 2005 (DE) .................... 10 2005 054 955

(51) Int. Cl.
*F21V 5/00* (2006.01)
(52) U.S. Cl. .................. 362/555; 362/244; 362/332
(58) Field of Classification Search .............. 362/555, 362/558, 249.02, 244, 332, 326
See application file for complete search history.

(56) References Cited

U.S. PATENT DOCUMENTS

| 6,139,156 | A  | * | 10/2000 | Okamori et al. ............... 353/98 |
| 6,318,863 | B1 |   | 11/2001 | Tiao et al. |
| RE37,578  | E  |   | 3/2002  | Gleckman |
| 6,412,953 | B1 |   | 7/2002  | Tiao et al. |
| 6,527,411 | B1 | * | 3/2003  | Sayers ......................... 362/245 |
| 6,547,400 | B1 |   | 4/2003  | Yokoyama |
| 6,843,591 | B1 | * | 1/2005  | Peng et al. .................... 362/560 |
| 6,871,982 | B2 |   | 3/2005  | Holman et al. |
| 7,194,185 | B2 | * | 3/2007  | Watanabe ..................... 385/146 |
| 7,234,820 | B2 | * | 6/2007  | Harbers et al. .................. 353/94 |

(Continued)

FOREIGN PATENT DOCUMENTS
DE         1 472 267         12/1969

(Continued)

OTHER PUBLICATIONS

R.S. Scharlack; *All-dielectric compound parabolic concentrator*; Oct. 1977; vol. 16, No. 10; Applied Optics.
A.D. Little; *Conceptual Design and Analysis of a compound Parabolic Concentrator*; Abstract Only; Argonne National Laboratory; 1977.

(Continued)

*Primary Examiner* — Jong-Suk (James) Lee
*Assistant Examiner* — Peggy A. Neils
(74) *Attorney, Agent, or Firm* — Fish & Richardson P.C.

(57) ABSTRACT

A light-emitting module is specified, comprising at least two light sources disposed on a common carrier. At least one of said light sources includes at least two LED chips. Each light source of the module is followed downstream by an optic body of an optical element, and the optic bodies are suitable for guiding electromagnetic radiation to a light exit surface of the optical element. An optical projection apparatus comprising such a light-emitting module is also specified.

19 Claims, 8 Drawing Sheets

U.S. PATENT DOCUMENTS

| | | | |
|---|---|---|---|
| 7,329,029 B2* | 2/2008 | Chaves et al. | 362/329 |
| 7,401,947 B2* | 7/2008 | Wanninger et al. | 362/300 |
| 7,445,340 B2* | 11/2008 | Conner et al. | 353/20 |
| 7,452,087 B2* | 11/2008 | Imade | 353/102 |
| 2004/0041984 A1* | 3/2004 | Tani et al. | 353/20 |
| 2004/0264185 A1 | 12/2004 | Grotsch et al. | |
| 2005/0111107 A1 | 5/2005 | Takeda et al. | |
| 2005/0173719 A1 | 8/2005 | Yonekubo et al. | |
| 2007/0008734 A1 | 1/2007 | Bogner et al. | |
| 2007/0024971 A1* | 2/2007 | Cassarly et al. | 359/487 |

FOREIGN PATENT DOCUMENTS

| | | |
|---|---|---|
| DE | 103 14 524 | 10/2004 |
| DE | 103 19 274 | 12/2004 |
| EP | 1 003 062 | 5/2000 |
| EP | 1 174 931 | 1/2002 |
| TW | 200425548 | 11/2004 |
| WO | WO2004/059990 | 7/2004 |
| WO | WO2004/088200 | 10/2004 |
| WO | WO2004/097846 | 11/2004 |

OTHER PUBLICATIONS

W.T. Welford; *The Optics of Nonimaging Concentrators*; 1978; Academic Press, Inc.; Harcourt Brace Jovanovich.

W.T. Welford; *High Collection Nonimaging Optics*; 1989; Academic Press, Inc.; Harcourt Brace Jovanovich.

Schnitzer, et al; *30% External Quantum Efficiency from Surface Textured, Thin-Film Light-emitting Diodes*; Applied Physics Letters; 53 (18); Oct. 18, 1993; American Institute of Physics.

Mohedano, et al.; *Ultracompact Nonimaging Devices for Optical Wireless Communications*; Optical Engineering, 39(10) pp. 2740-2747; Oct. 2000; Societyof Photo-Optical Instrumentation Engineers.

Taiwan Patent Office, "Notification for the Opinion of Examination", Application No. 95131886, mailed on Aug. 25, 2009 (11 pages).

"First Office Action", Application No. 200680032033.8, mailed on Nov. 27, 2009 (10 pages).

* cited by examiner

FIG 2C View B

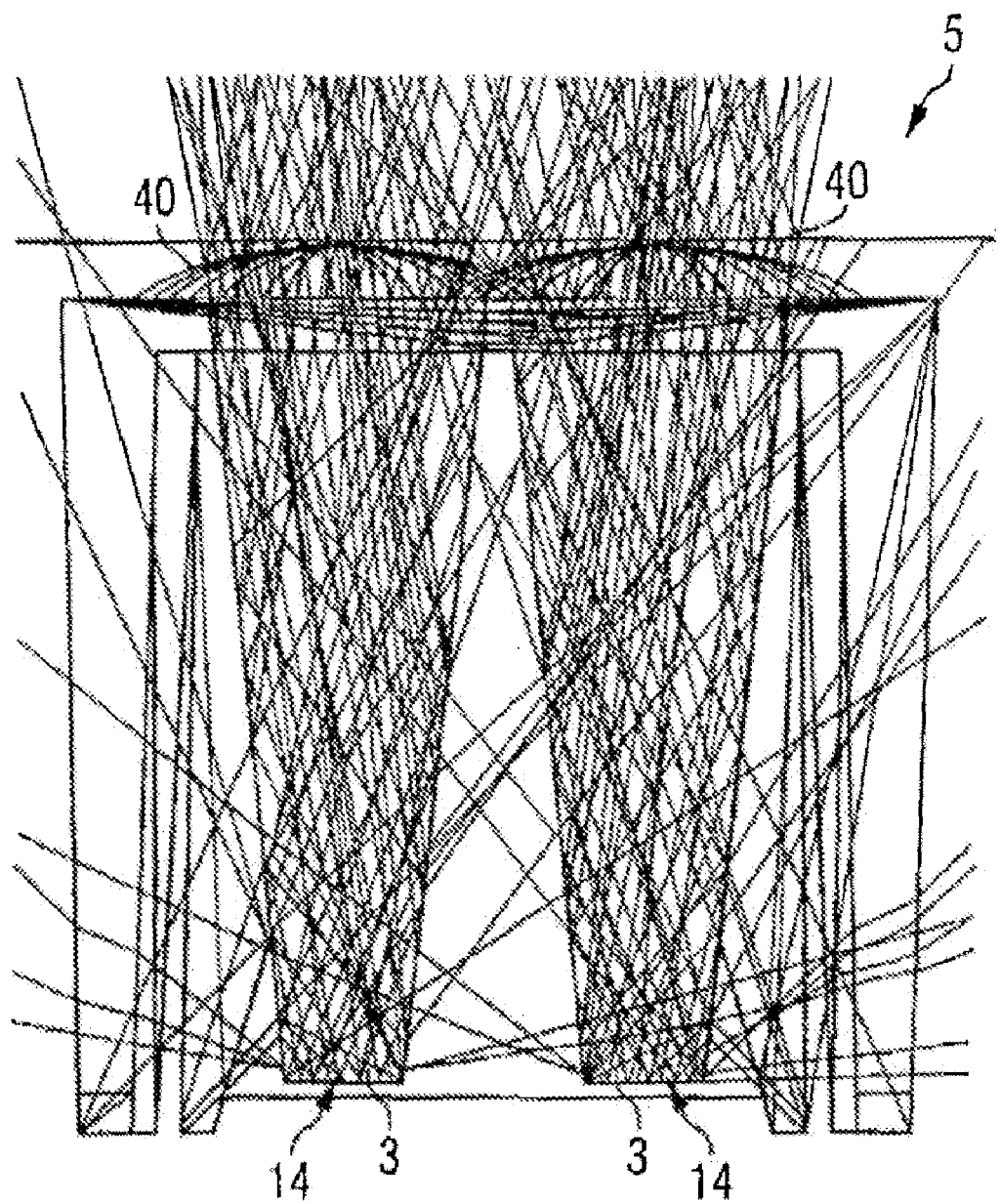
FIG 2D Section A-A'

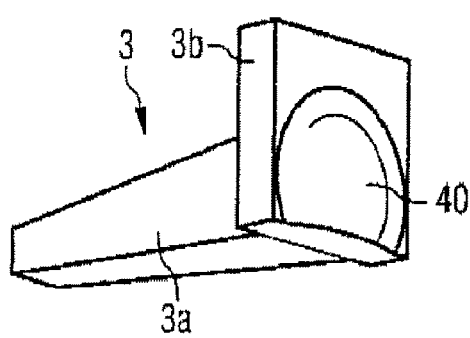
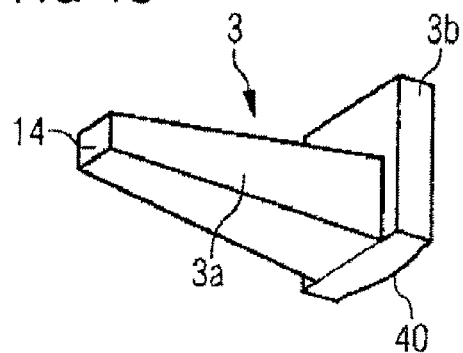
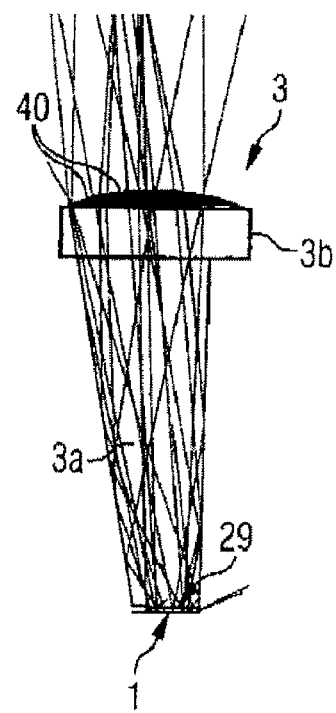

Table 1

| Radius [mm] | Sag [mm] |
|---|---|
| 0.000 | 0.00000 |
| 0.001 | 0.00000 |
| 0.003 | -0.00010 |
| 0.005 | -0.00010 |
| 0.007 | -0.00020 |
| 0.009 | -0.00020 |
| 0.011 | -0.00030 |
| 0.013 | -0.00040 |
| 0.015 | -0.00040 |
| 0.017 | -0.00050 |
| 0.019 | -0.00050 |
| 0.021 | -0.00060 |
| 0.023 | -0.00060 |
| 0.025 | -0.00070 |
| 0.027 | -0.00070 |
| 0.029 | -0.00080 |
| 0.031 | -0.00080 |
| 0.033 | -0.00090 |
| 0.035 | -0.00090 |
| 0.037 | -0.00100 |
| 0.039 | -0.00110 |
| 0.041 | -0.00110 |
| 0.043 | -0.00120 |
| 0.045 | -0.00120 |
| 0.047 | -0.00130 |
| 0.049 | -0.00130 |
| 0.051 | -0.00140 |
| 0.053 | -0.00140 |
| 0.055 | -0.00150 |
| 0.057 | -0.00160 |
| 0.059 | -0.00160 |
| 0.061 | -0.00170 |
| 0.063 | -0.00170 |
| 0.065 | -0.00180 |
| 0.067 | -0.00180 |
| 0.069 | -0.00190 |
| 0.071 | -0.00200 |
| 0.073 | -0.00200 |
| 0.075 | -0.00210 |
| 0.077 | -0.00210 |
| 0.079 | -0.00220 |
| 0.081 | -0.00220 |
| 0.083 | -0.00230 |
| 0.085 | -0.00240 |
| 0.087 | -0.00240 |
| 0.089 | -0.00250 |
| 0.091 | -0.00250 |
| 0.093 | -0.00260 |
| 0.095 | -0.00270 |
| 0.097 | -0.00270 |
| 0.099 | -0.00280 |
| 0.101 | -0.00280 |
| 0.103 | -0.00290 |
| 0.105 | -0.00300 |
| 0.107 | -0.00300 |
| 0.109 | -0.00310 |
| 0.111 | -0.00310 |
| 0.113 | -0.00320 |
| 0.115 | -0.00320 |

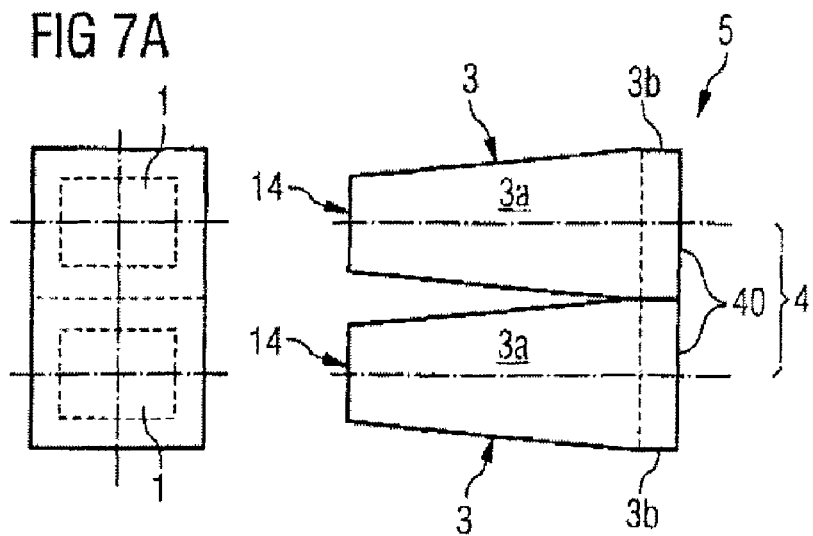
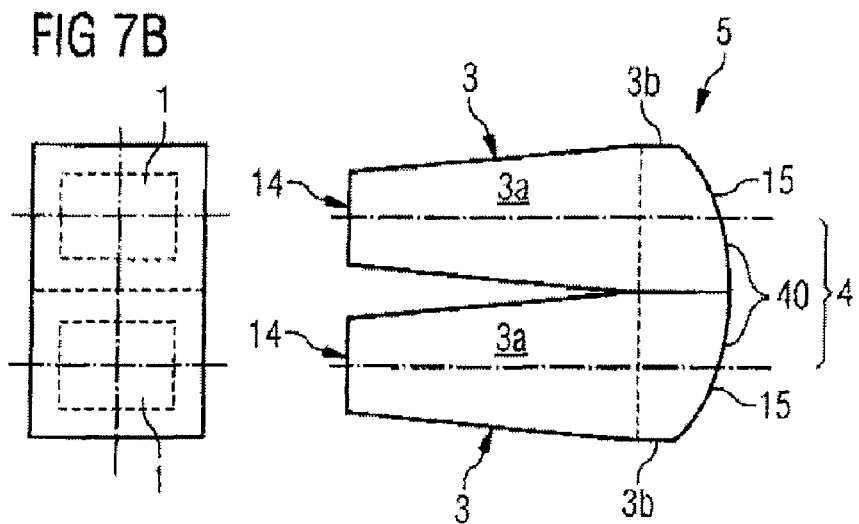
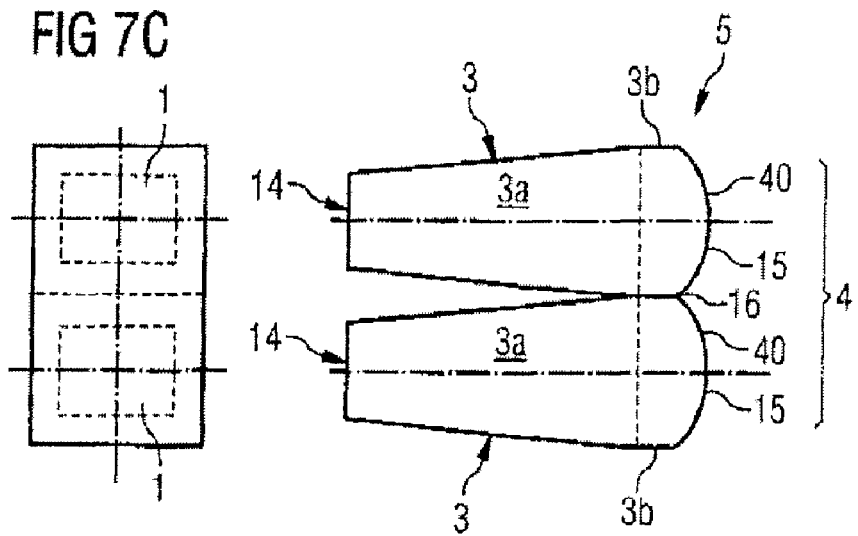

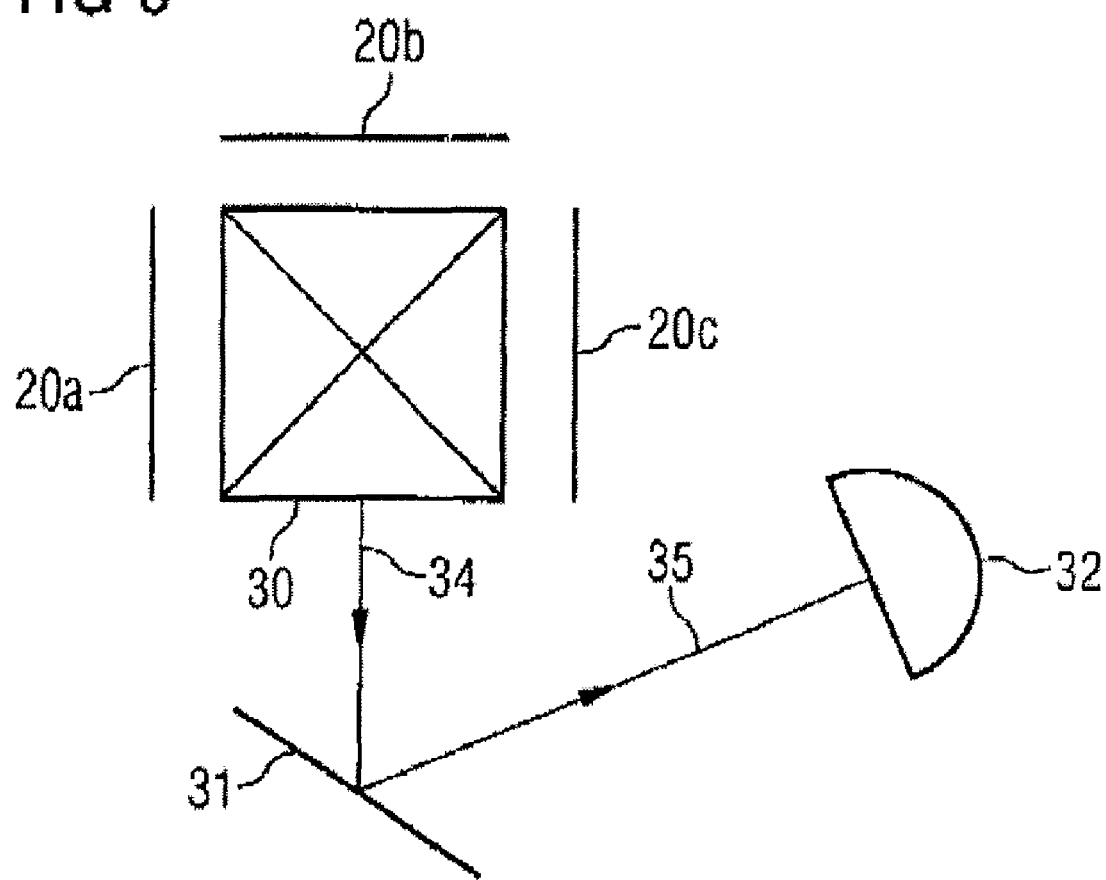

LIGHT-EMITTING MODULE, PARTICULARLY FOR USE IN AN OPTICAL PROJECTION APPARATUS

CROSS-REFERENCE TO RELATED APPLICATIONS

This application is the National Stage of International Application No. PCT/DE2006/001522, filed Aug. 31, 2006, which claims priority to German Patent Application No. 10 2005 041 319.6, filed Aug. 31, 2005, and German Patent Application No. 10 2005 054 955.1, filed Nov. 17, 2005, the contents of which are incorporated herein by reference.

TECHNICAL FIELD

The disclosure relates to a light-emitting module. The light-emitting module is suitable in particular for use in an optical projection apparatus. An optical projection apparatus comprising such a light-emitting module is also specified.

BACKGROUND

The document EP 100 30 62 A1 describes an optical projection apparatus.

SUMMARY

One object to be achieved is to specify a particularly compact light-emitting module. Another object is to specify a light-emitting module that has increased mechanical stability. A further object is to specify a particularly compact optical projection apparatus.

According to at least one embodiment of the light-emitting module, the light-emitting module comprises at least two light sources. The light sources are disposed on a common carrier.

The carrier is, for example, a circuit board. The carrier is then provided with conductive traces and contact points by means of which the light sources of the module can be electrically contacted. The carrier is further preferably suitable for dissipating heat that develops during the operation of the light sources. To this end, the carrier preferably has good thermal conductivity. The carrier is, for example, a printed circuit board (PCB) or, particularly preferably, a metal-core board comprising a metal such as copper or aluminum.

According to at least one embodiment of the light-emitting module, one of the light sources includes at least two light-emitting diode (LED) chips. That is, at least that light source contains as light-generating elements two or more LED chips that are able to generate electromagnetic radiation collectively, preferably simultaneously, when the light source is contacted. The LED chips of the light source may also be contactable separately from one another in this case. The LED chips of the light source are arranged, for example, in a square or rectangular array of N×M LED chips. A light source can, for example, comprise 2×3 LED chips. The LED chips are then arranged in two rows of three LED chips each. Other light sources of the light-emitting module can comprise single LED chips or also a plurality of LED chips.

According to at least one embodiment of the light-emitting module, each light source of the module is followed downstream by an optic body of an optical element. "Followed downstream by" means in this context that the optic body is disposed after the light source in a main radiation direction of the light source. The optic body is thereby arranged relative to the light source such that the bulk of the electromagnetic radiation generated by the light source during operation enters the optic body and can be influenced by the optic body in passing through it.

A respective optic body of the optical element is preferably associated on a one-to-one basis with each light source. That is, the optical element comprises a plurality of optic bodies. The number of optic bodies is equal to the number of light sources. Each light source has associated with it a separate optic body of the optical element. This also means that, at least in the case of the light sources comprising at least two LED chips, this plurality of LED chips is followed downstream by a common optic body.

According to at least one embodiment of the light-emitting module, the optic bodies are suitable for guiding electromagnetic radiation generated during the operation of the light sources to a light exit surface of the optical element. That is, the optic bodies are so arranged as to conduct electromagnetic radiation generated by the light sources of the module during operation from the light sources to a light exit surface of the optical element. Such a light exit surface of the optical element can be present in a component of the optical element that is separate from the optic bodies. To this end, the light exit surface of the optical element can be formed, for example, by the surface of a cover plate of the optical element. It is also possible, however, for the light exit surface of the optical element to be formed by the light exit surfaces of the optic bodies and, for example, to be composed of said surfaces.

Such a light exit surface of an optic body is the surface through which the bulk of the electromagnetic radiation coupled into the optic body leaves the optic body. Electromagnetic radiation that passes through the light exit surface of the optic body on its way out of the optic body can no longer be optically influenced by the optic body.

If the optic body is formed by a hollow body, the light exit surface can also be a virtual or imaginary surface. Once electromagnetic radiation has passed through this surface in proceeding away from the optic body, the radiation can no longer be optically influenced by the optic body. The imaginary surface is, for example, delimited by the upper edge of the optic body on the side facing away from the light source.

The light exit surface of the optical element and/or the light exit surfaces of the optic bodies are preferably suitable for optically influencing the electromagnetic radiation passing through them. These surfaces can then serve to beam-shape the electromagnetic radiation passing through the optical element. It is further possible for the light exit surfaces of the optical element and/or of the optic bodies to be suitable for reducing the probability of total reflection as the radiation exits the optical element. The light exit surfaces then serve to increase the radiated power of the light-emitting module. Furthermore, the component of the optical element that includes the radiation exit surface can also constitute a mechanical protection, for example of the light sources against contact or contamination.

According to at least one embodiment of the light-emitting module, the light-emitting module comprises at least two light sources disposed on a common carrier. At least one of such light sources includes two LED chips, each light source being followed downstream by an optic body of an optical element and the optic bodies being suitable for guiding electromagnetic radiation to a light exit surface of the optical element.

According to at least one embodiment of the light-emitting module, at least one of the optic bodies of the optical element includes a non-imaging optical concentrator. Preferably all the optic bodies of the optical element are formed by non-imaging optical concentrators. The optical concentrator preferably tapers to the light source downstream of which it is disposed. That is, in other words, its cross-sectional area increases with increasing distance from the light source. In this case, the optic body can consist of a concentrator or can include other components, for example a cover plate, in addition to the concentrator.

The optic body can be formed at least locally in the manner of one of the following basic optical elements: a compound parabolic concentrator (CPC), a compound elliptic concentrator (CEC), a compound hyperbolic concentrator (CHC). The lateral surfaces of the optic body are then formed at least locally in the manner of one of these basic optical elements.

It is further possible for the optic body to be shaped at least locally in the manner of a truncated cone or truncated pyramid tapering to the light source.

In all these embodiments, the optic body can be configured as a solid body. In such case, any guidance of electromagnetic radiation in the optic body takes place at least partially by total reflection from its lateral surfaces. In addition, the surface of the solid body can be coated at least locally with a reflective material.

It is further possible for the optic body to be configured as a hollow body whose inner surfaces are reflectively implemented. For example, the inner surfaces of the optic body are in that case reflectively coated with a metal. If the optic body is formed by a hollow body, then the light exit surface is the imaginary, planar surface that covers the opening in the optic body facing away from the light source. That is, this surface interconnects the lateral surfaces of the optic body at its light exit opening.

According to at least one embodiment of the light-emitting module, the optic body includes a non-imaging optical concentrator that is configured as a truncated pyramid. That is, the optic body has, for example, a rectangular light entrance surface and a rectangular light exit surface, which are connected to each other by the lateral surfaces of the optic body.

Such a truncated pyramid may be symmetrical. That is, it is symmetrical with respect to a center axis that passes through the geometric center of the light entrance surface and is perpendicular to said light entrance surface. This center axis then also passes through the geometric center of the light exit surface. It is further possible for the optic body to be formed by an asymmetrical truncated pyramid, in which case the center axis through the geometric center of the light entrance surface does not coincide with the center axis through the geometric center of the light exit surface.

The specified light-emitting module makes use, inter alia, of the realization that by using as optic bodies a plurality of optical concentrators, each of which is disposed downstream of a respective group of LED chips, and by having a common light exit surface for the optical element, the same optical effect can be obtained as if all the LEDs of the module were followed downstream by a single, common optical concentrator. Compared to such a single optical concentrator, the light-emitting module described here has an optical element whose length is reduced by up to about 50 percent. This means that due to the use of plural optical concentrators, the concentrators can be implemented as shorter. Such an optical element therefore permits a particularly compact light-emitting module. Furthermore, the reduced length of the optical element increases the mechanical stability of the light-emitting module.

According to at least one embodiment of the light-emitting module, the optic body is formed by a solid body. This has proven particularly advantageous, for example, if the optic body is implemented as a truncated pyramid. The optic body configured as a solid body preferably contains a transparent material with a refractive index greater than 1.4. Reflections from the lateral surfaces of the optic body then preferably occur by total reflection. The optic body can be formed, for example, of a transparent plastic or glass. If the optic body consists of a transparent plastic, then it is preferably injection molded or transfer molded. In that case, the optic body preferably comprises or consists of at least one of the following materials: PMMA, PMMI, PC, COC (for example Zeonex or TOPAS), silicone.

In the case of an optic body configured as a solid body, the light exit surface of the optic body is preferably configured as integral to the optic body. It can be implemented as flat or as a surface with a curvature.

According to at least one embodiment of the light-emitting module, the optical element is configured in one piece. That is, the optic body of the optical element and other components of the optical element, as appropriate, are integrally connected to one another. For this purpose, the optical element is produced for example by an injection molding or transfer molding process. In that case, the width of the web deriving from the production process that is present between the individual optic bodies of the optical element is preferably selected to be as small as possible. This ensures that the optical properties of the optical element are affected as little as possible by the web. The one-piece optical element, due to its compactness, is distinguished by particularly easy handling during the mounting of the optical element on the carrier of the light-emitting module.

According to at least one embodiment of the light-emitting module, the optical element of the module is configured in more than one piece. That is, components of the optical element are fabricated separately from one another. These components, too, can for example be injection molded or transfer molded. The optic bodies of the optical element are preferably fabricated separately from one another in this case. The optic bodies can have light exit surfaces which, when the optical element is assembled, form the light exit surface of the optical element. It is further possible for the component comprising the light exit surface of the optical element to be fabricated separately from the optic bodies, or for both the optic bodies and the component comprising the light exit surface of the optical element to be fabricated separately from one another. With separately formed optic bodies, there advantageously does not have to be a web between the optic bodies.

According to at least one embodiment of the light-emitting module, the light exit surface of the optical element is formed by a convex surface that extends over the light exit surfaces of the optic bodies. The light exit surface of the optical element can in this case, for example, be arched over the optic bodies of the optical element. In other words, the light exit surface then spans the optic bodies in a dome-like manner. In this embodiment, the light exit surface can be part of a separate component of the optical element that is fabricated separately from the optic bodies, for example an arcuate cover plate of the optical element.

It is also possible, however, for the light exit surface of the optical element to be formed locally by light exit surfaces of the optic bodies. In this case, the light exit surface of the optical element is composed of light exit surfaces of the optic bodies. For example, each of the optic bodies can have a light exit surface that forms part of the light exit surface of the optical element. The assembled optical element then has a light exit surface that extends over and consists of the light exit surfaces of the optic bodies.

According to at least one embodiment of the light-emitting module, the optical element of the module has a light exit surface comprising convex subregions that are interconnected by concave subregions. The convex subregions can in this case extend over the light exit surfaces of plural optic bodies. It is also possible, however, for convex subregions to be associated with the optic bodies on a one-to-one basis. In this case, for example each optic body can be followed downstream by an arcuation of the light exit surface of the optical element, which then optically influences primarily the electromagnetic radiation passing through that optic body. Concave subregions interconnecting the convex subregions then include both concavely curved subregions of the light exit surface of the optical element and peaks, notches and other indentations in the light exit surface. It is further possible for the convex subregions to be interconnected by planar surface sections of the light exit surface of the optical element.

In addition to its optical properties, a curved light exit surface also proves to be advantageous in the production of the optic body. If the optic body is a solid body, when an optic body having a planar light exit surface is to be fabricated, uncontrollable production variations can occur during the curing of the optic body. That is, the light exit surface then presents convexly and concavely curved subregions in a way that cannot be planned in advance. A curved light exit surface having a prescribed radius of curvature, on the other hand, allows the light exit surface to stabilize itself. Curved subregions of the light exit surface preferably have for this purpose a radius of curvature of at least 100 mm, preferably at least 50 mm.

According to at least one embodiment of the light-emitting module, the light exit surface of the optical element is composed of the light exit surfaces of the optic bodies. That is, the light exit surface of the optical element is not a separate component of the optical element, but is composed of a plurality of parts, each of which individually forms the light exit surface of an optic body. This is preferably the case when the optical element is configured in more than one piece and the optic bodies are fabricated separately from one another. The optic bodies can then, for example, have respective convexly curved light exit surfaces. The optic bodies are configured for this purpose such that when the optical element is assembled, the light exit surfaces of the optic bodies complement one other form-lockingly to form a light exit surface of the optical element.

In this case, for example a light exit surface of the optical element that extends as an arcuate surface over all the optic bodies can also be formed by the light exit surfaces of the optic bodies. Light passing into an optic body through the light entrance surface can then exit with a defined probability through the radiation exit surface of another optic body, for example an adjacent one.

As a whole, therefore, the composite light exit surface of the optical element forms a basic optical element—for example a concentrator lens—for the entire optical element. That is, a common concentrator lens for the light from all light sources of the module is created only by assembling the individual optic bodies. In other words, the optical properties of the light exit surface of the optical element are not merely the sum of the optical properties of the light exit surfaces of separate optic bodies.

According to at least one embodiment of the light-emitting module, the light-emitting module comprises at least one optic body whose light exit surface has an antireflection coating comprising a dielectric material. This coating serves to dereflect the light exit surface of the optic body, thereby increasing the probability of light entering the optic body. The light exit surfaces of all optic bodies of the optical element are preferably coated in this manner. It is further possible for the light exit surface of the optic body and/or the light exit surface of the optical element to have such a coating. For example, the light-passing surfaces of the optical element can be coated via a dip-coating method. Especially suitable candidates for this purpose are porous sol-gel layers, which permit particularly low-cost coating of the plastic or glass from which the components of the optical element are made.

According to at least one embodiment of the light-emitting module, the light entrance surface of at least one optic body has a periodic microstructure suitable for reducing the reflection of electromagnetic radiation. Such a periodic microstructure can be imparted, for example, as an alternative to or in addition to an antireflection coating. The dereflection can be optimized to the desired wavelength range by adjusting the period and depth of the periodic microstructure. If the periodic microstructure is implemented, for example, in a wave shape with a period of between 3 and 7 µm and a depth of between 6 and 9 µm, then the structure is particularly well suited for dereflection in the wavelength range of 10 to 20 µm. Dereflection in the visible region is also possible by suitable choice of the period of the microstructure. The period length of the structure is in that case preferably smaller than the wavelengths to be dereflected.

The structure can be imparted, for example, by making impressions of holographically produced stamps in the material of the optic body, which in that case is preferably configured as a solid body. In addition to the light entrance surfaces of the optic bodies, other light-passing surfaces of the optical element, such as the light exit surface of the optic body and/or of the optical element, can have such a periodic microstructure to bring about dereflection.

According to at least one embodiment of the light-emitting module, at least one of the LED chips of the module is free of encapsulant. That is, no epoxy-resin- or silicone-containing encapsulant is present downstream of this LED chip. The LED chip thus is not embedded in a potting compound. The light outcoupling surface of the LED chip is freely accessible. This LED chip is followed downstream by the light entrance surface of an optic body, so light from the LED chip radiates into the optic body without first passing through an encapsulant. This makes it possible for electromagnetic radiation to radiate into the optic body without being partially absorbed by an encapsulant. Furthermore, there is no possibility of ageing or detachment of the encapsulant.

According to at least one embodiment of the light-emitting module, an air gap is disposed between the light outcoupling surface of an LED chip of the module and the radiation entrance surface of the optic body associated with said LED chip. That is, the light entrance surface of the optic body and the light outcoupling surface of the LED chip are not interconnected by an encapsulant or a material for matching the refractive index, for instance an index-matching gel, but instead, there is a gap between these surfaces, and this gap is preferably filled with air. It is thereby possible for the LED chip to comprise a thin encapsulant that does not extend to the light entrance surface of the optic body, or for the LED chip to be encapsulant-free.

According to at least one embodiment of the light-emitting module, the distance between the light entrance surface of an optic body of the optical element and the light exit surface of at least one LED chip is no more than 250 µm, preferably no more than 200 µm, particularly preferably no more than 100 µm. In an encapsulant-free LED chip, this distance is limited only by any contacting wire that may be present for electrically contacting the LED chip, for example on the n-side. Such a small distance between the light entrance surface of the optic body and the light outcoupling surface of the LED chip makes it possible to couple the largest possible proportion of the light emitted by the LED chip into the optic body.

According to at least one embodiment of the light-emitting module, the optical element comprises a holder to which the optic bodies are attached. This holder can be a separate component of the optical element, or it can be configured in one piece with the optical element. The optic bodies are preferably attached to this holder on their sides facing away from the light entrance surfaces. The optic bodies can, for example, be glued to the holder, snapped into it, or placed in it. It is further possible for the optic bodies to be integrally connected to the holder. In that case, the optic bodies can be fabricated along with the holder in an injection molding or transfer molding process. It is further possible for a component of the optical element—for example a cover plate comprising the light exit surface of the optical element—to be attached to the holder or configured integrally therewith.

The holder is preferably implemented as frame-like, box-like or in the manner of a hollow cylinder having a round or oval base. The components of the optical element, such as, for example, the optic bodies, are then preferably fastened to the holder on its side facing away from the carrier of the module.

Such a frame-like holder makes use, inter alia, of the realization that thermal tensions in the optical element are offset particularly well by such a holder. For example, should the optical element heat up during the operation of the light sources, then the holder attached to the carrier expands away from the carrier. The optic bodies, which are preferably attached to the side of the holder facing away from the carrier, expand in the direction of the carrier from the side of the holder facing away from the carrier. In this way, the thermal expansion of the holder away from the carrier and of the optic body toward the carrier can balance each other out. The distance of the light outcoupling surfaces of the LED chips from the light entrance surfaces of the optic bodies thus remains at least roughly constant. In this case, the holder and the optic bodies preferably have matching thermal expansion coefficients, and to this effect are, for example, made of the same material.

According to at least one embodiment of the light-emitting module, the holder surrounds the optic bodies of the optical element on at least four sides. In that case, lateral surfaces of the holder extend along the optic bodies. For this purpose, the holder can be configured for example in the manner of a box or a hollow cylinder.

According to at least one embodiment of the light-emitting module, the holder surrounds the light sources on at least four sides. For this purpose, the holder can be configured for example as box-like. To this end, the lateral surfaces of the holder are at least locally in contact with the carrier of the module—for example, they rest on the carrier. The holder thereby constitutes a mechanical protection for the light sources, which, for example, comprise unencapsulated LED chips.

An optical projection apparatus is further specified. The optical projection apparatus preferably comprises at least one light-emitting module according to at least one of the above-described embodiments. The optical projection apparatus preferably comprises a plurality of such light-emitting modules, which could, for example, be suitable for generating light of different colors. For instance, one of the modules may be suitable for emitting light in the green region of the spectrum. Another module may be suitable for emitting light in the red region of the spectrum. A third module may be suitable for generating light in the blue region of the spectrum.

According to at least one embodiment of the optical projection apparatus, the light-emitting modules are disposed on the lateral surfaces of a dichroic beam splitter (an X-cube). If red, blue and green light is beamed onto three different lateral surfaces at the same times and with suitable intensities, then white mixed light leaves the X-cube through another lateral surface.

According to at least one exemplary embodiment of the optical projection apparatus, the optical projection apparatus can further comprise an imaging unit, such as, for example, an array of separately drivable micromirrors (a digital mirror device, DMD) or an LCD panel.

According to at least one embodiment of the optical projection apparatus, the optical projection apparatus can comprise a projection lens suitable for projecting light from at least one of the light-emitting modules onto a projection surface.

Further advantages, preferred embodiments and improvements of the light-emitting module and of the optical projection apparatus will become apparent from the following exemplary embodiment explicated in conjunction with the figures.

DESCRIPTION OF THE DRAWINGS

FIG. 2C is a schematic sectional representation from a first direction of the optical element as depicted in FIG. 2A, FIG. 2D is a schematic sectional representation from a second direction of the optical element as depicted in FIG. 2A, FIGS. 4B and 4C are schematic perspective sketches of optic bodies of the optical element of the fourth exemplary embodiment, FIG. 4D is a schematic sectional representation of an optic body as used in the fourth exemplary embodiment of the module, FIGS. 7A, 7B and 7C are schematic sectional representations of exemplary embodiments of the optical element, and FIG. 8 is a schematic sectional representation of an exemplary embodiment of the here described optical projection apparatus.

DETAILED DESCRIPTION

Figure 1:
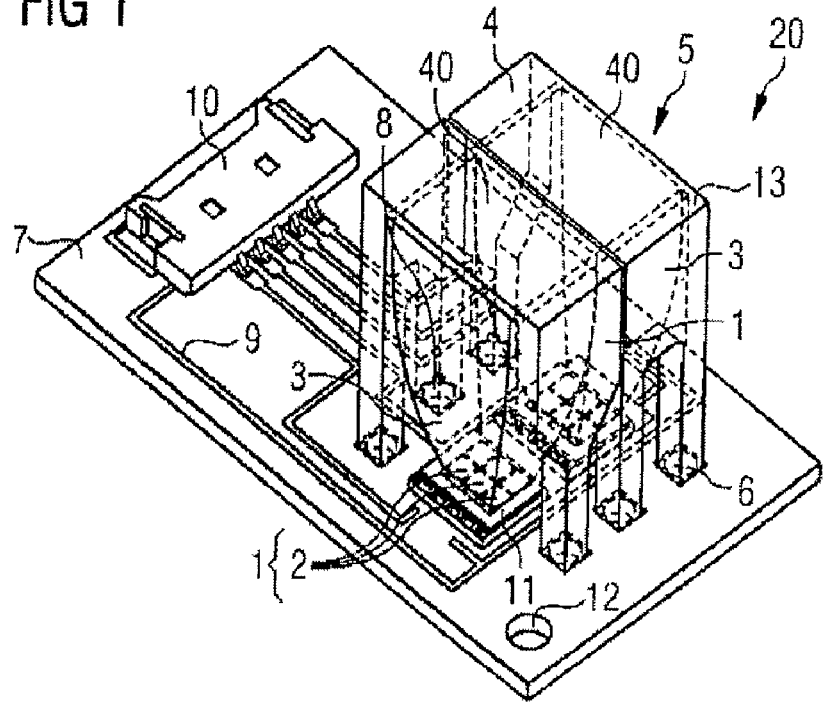
FIG. 1 is a schematic perspective sketch of a first exemplary embodiment of the here described light-emitting module.

In the exemplary embodiments and figures, like or like-acting elements are provided with the same respective reference numerals. The depicted elements and the size relationships of the elements to one another are not to be considered true to scale. Rather, some details of the figures are depicted as exaggeratedly large for the sake of better understanding.

FIG. 1 is a schematic perspective sketch of a first exemplary embodiment of the here described light-emitting module.

The light-emitting module 20 of the first exemplary embodiment comprises two light sources 1. The light sources 1 each include two times three LED chips 2. Each light source 1 is followed downstream by the optic body 3 of an optical element 5.

The optic bodies 3 in the exemplary embodiment of FIG. 1 are non-imaging concentrators configured in the manner of a CPC optic described earlier hereinabove. These concentrators are preferably implemented as solid bodies, such that the lateral walls guide the light from the radiation entrance surface to the radiation exit surface 4 by total internal reflection.

The optic bodies 3 guide the light from the light sources 1 to a cover plate of the optical element 5, which cover plate comprises the radiation exit surface 4 of the optical element 5. Said radiation exit surface 4 of the optical element 5 is disposed downstream of the radiation exit surfaces 40 of the optic bodies 3.

The optic bodies 3 and the radiation exit surface 4 are attached to a holder 13 comprising dowel pins 8. The dowel pins 8 engage in corresponding recesses 6 in the carrier 7 of the light-emitting module 20. The dowel pins 8 thereby contribute to the mechanical attachment and/or the alignment of the optical element 5 on the carrier 7.

The carrier 7 is formed, for example, by a metal-core board, which may have bores 12 by means of which the carrier 7 can be attached to, for example screwed onto, a module carrier (not shown). The metal-core board in this case preferably comprises metals that are good conductors of heat, such as aluminum or copper.

The carrier 7 comprises conductive traces 9 that connect a plug-type connection 10, by means of which the module can be electrically contacted from the outside, to the light sources 1.

The LED chips 2 of the light sources 1 are, for example, disposed on a ceramic carrier 11 comprising through-contacts (vias) in order to contact the LED chips 2 to the conductive traces 9 of the carrier 7. The radiation outcoupling surface of an LED chip 2 of a light source 1 has, for example, an area of about 1 mm$^2$. The spacing between the LED chips 2 of a light source 1 is preferably less than 100 μm.

The LED chips 2 are particularly preferably so-called thin-film LED chips. That is, at least one LED chip 2 has a light outcoupling surface through which the bulk of the electromagnetic radiation emitted by the LED chip 2 is coupled out. Particularly preferably, all the radiation emitted by the LED chip 2 exits through the light outcoupling surface. The light outcoupling surface is formed, for example, by a portion of the surface of the LED chip 2. The radiation outcoupling surface is preferably formed by a main surface of the LED chip 2, which is, for example, arranged parallel to an epitaxial layer sequence of the LED chip 2 that is suitable for generating electromagnetic radiation.

For this purpose, the epitaxial layer sequence can, for example, comprise a pn junction, a double heterostructure, a single quantum well or a multiple quantum well structure (MQW). The term "quantum well structure" can include any structure in which charge carriers undergo quantization of their energy states by confinement. In particular, the term "quantum well structure" carries no implication as to the dimensionality of the quantization. It therefore includes, among other things, quantum troughs, quantum wires and quantum dots and any combination of these structures.

The LED chip 2 is preferably an LED chip from which the growth substrate is at least partially removed and which has a carrier element disposed on its surface facing away from the original growth substrate.

The carrier element can be relatively freely selected in comparison to a growth substrate. A carrier element is preferably selected that is particularly well matched to the radiation-generated epitaxial growth sequence with respect to its temperature expansion coefficient. Furthermore, the carrier element can comprise a material that is a particularly good thermal conductor. In this way, the heat generated by the LED chip 2 in operation can be dissipated particularly efficiently from the carrier 7.

Such LED chips 2 produced by removing the growth substrate are often referred to as thin-film LED chips and are preferably distinguished by at least one of the following features:

Applied to or formed on a first main surface of a radiation-generating epitaxial layer sequence, which surface faces a carrier element, is a reflective layer that reflects at least some of the electromagnetic radiation generated in the epitaxial layer sequence back into the latter.

The epitaxial layer sequence has a thickness in the region of 20 μm or less, particularly preferably in the region of 10 μm or less.

Furthermore, the epitaxial layer sequence preferably comprises at least one semiconductor layer having at least one surface with an intermixed structure. In the ideal case, this intermixed structure brings about a nearly ergodic distribution of the light in the epitaxial layer sequence, i.e., said layer has a stochastic scattering behavior that is as ergodic as possible.

A basic principle of a thin-film LED chip is described, for example, in I. Schnitzer et al., *Appl. Phys. Lett.* 63 (16), Oct. 18, 1993, pages 2174-2176, whose disclosure content with regard to the basic principle of a thin-film LED chip is hereby incorporated by reference.

The distance between the centers of the two light sources 1 of the light-emitting module 20 is between 5 and 6 mm in the exemplary embodiment of FIG. 1.

Figure 2A:
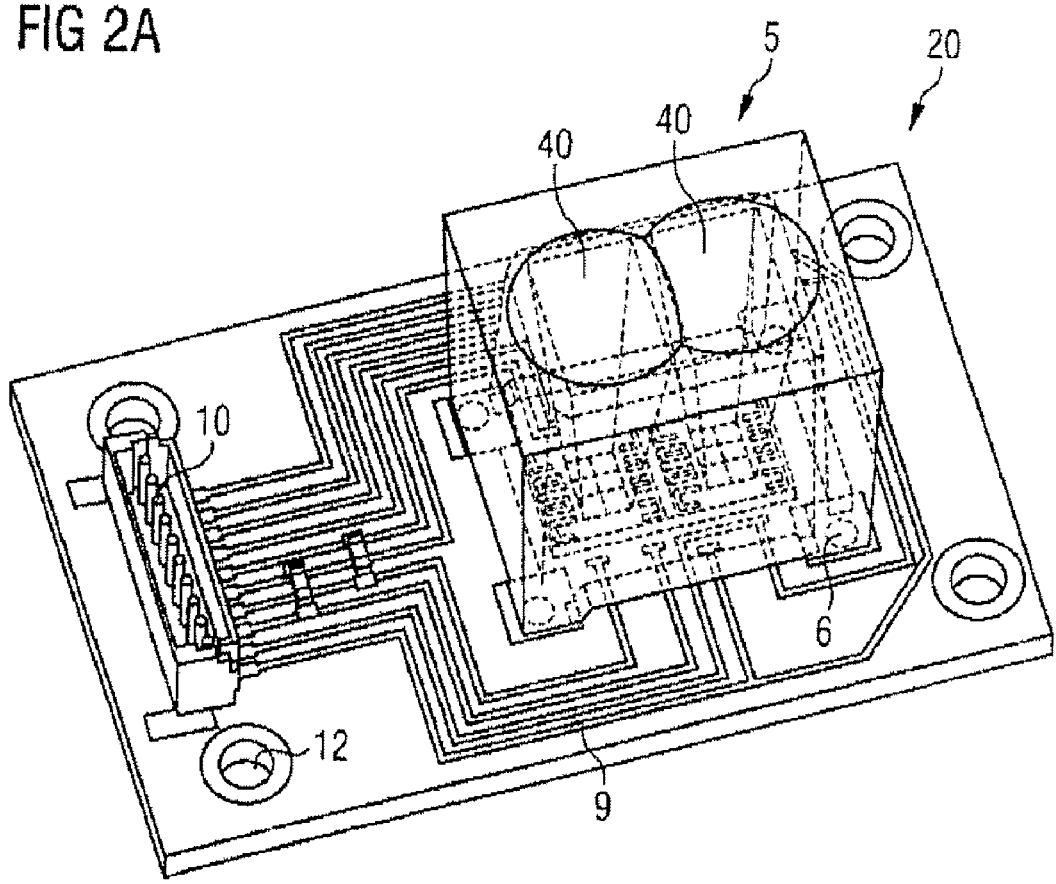
FIG. 2A is a schematic perspective sketch of a second exemplary embodiment of the here described light-emitting module.

FIG. 2A is a schematic perspective representation of a second exemplary embodiment of the here described light-emitting module 20.

Figure 2B:
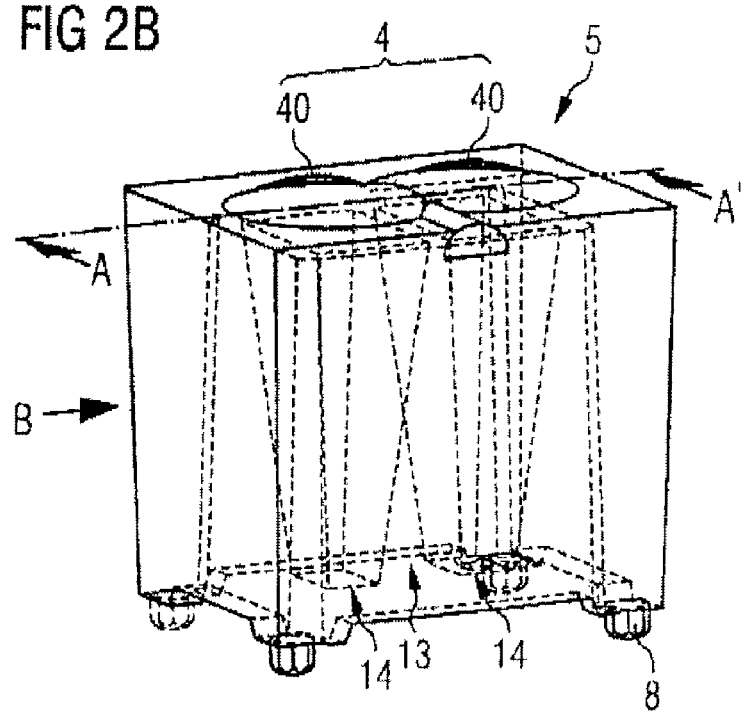
FIG. 2B is a schematic perspective sketch of the optical element for the second exemplary embodiment of the light-emitting module.
Figure 2B:
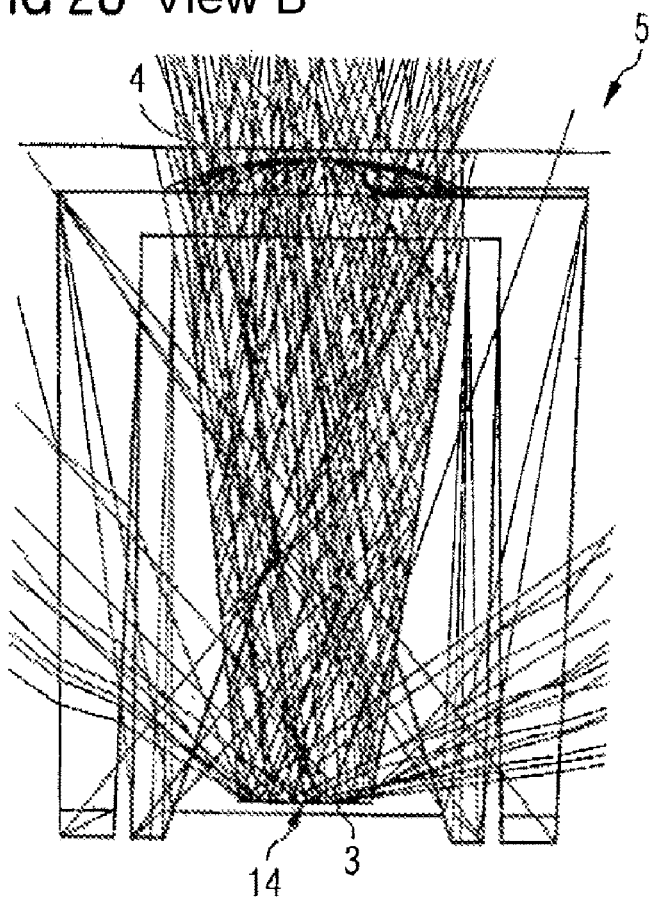

As distinguished from the exemplary embodiment described in conjunction with FIG. 1, the light-emitting module 20 of FIG. 2A comprises a box-like holder 13 of the optical element 5. That is, the optical element 5 comprises a holder 13 (see also the sectional view along line AA' of FIG. 2B and the sectional view along line BB' of FIG. 2C) that surrounds the light sources 1 and the optic bodies 3 on four sides. Lateral surfaces of this holder 13 rest locally on the carrier 7. The optical element 5 of FIG. 2A thereby constitutes a mechanical protection for the LED chip 2 and the optic bodies 3. The LED chips 2 can thus, for example, be encapsulant-free. The light entrance surfaces 14 of the optic bodies 3 are preferably disposed at a distance of between 100 and 250 μm from the respective radiation outcoupling surfaces of the LED chips 2. The gap between the LED chips 2 and the light entrance surface 14 is preferably filled with air.

In the exemplary embodiment of FIG. 2A, the optic bodies 3 of the optical element 5 are preferably solid bodies that are fabricated separately from one another and are attached to the holder 13. Each of them has a radiation exit surface 40. The radiation exit surfaces 40 of the optic bodies 3 complement one another to form the radiation exit surface 4 of the optical element 5 (see also the schematic sectional representations of FIGS. 2C and 2D). It is possible in this case for light entering through the radiation entrance surface 14 of one optic body 3 to exit the optical element 5 through the radiation exit surface of another optic body. For example, the optic bodies 3 can be truncated pyramid optics. The light from the arrays of LED chips 1, which are allocated to two light sources 1, is then collected by the optic bodies 3 and redistributed on a rectangular light exit surface 4 of the optical element 3.

The optical element 5 is preferably attached to and/or aligned on the carrier 7 by means of dowel pins 8 having a star-shaped cross section. In the exemplary embodiment of the light-emitting module 20 illustrated in FIG. 2A, the length of the carrier 7 is about 4.0 cm. The width is about 2.5 cm. The height of the optical element 5, from the carrier to the apex of the radiation exit surface 4, is about 2.5 cm. Each optic body 3 is followed downstream in this case by an array of 2×3 LED chips 2. Compared to this, a single optic body followed by twelve LED chips would have to be about twice as long to achieve the same optical effect as the optical element 5 described in conjunction with FIG. 2B.

Figure 3:
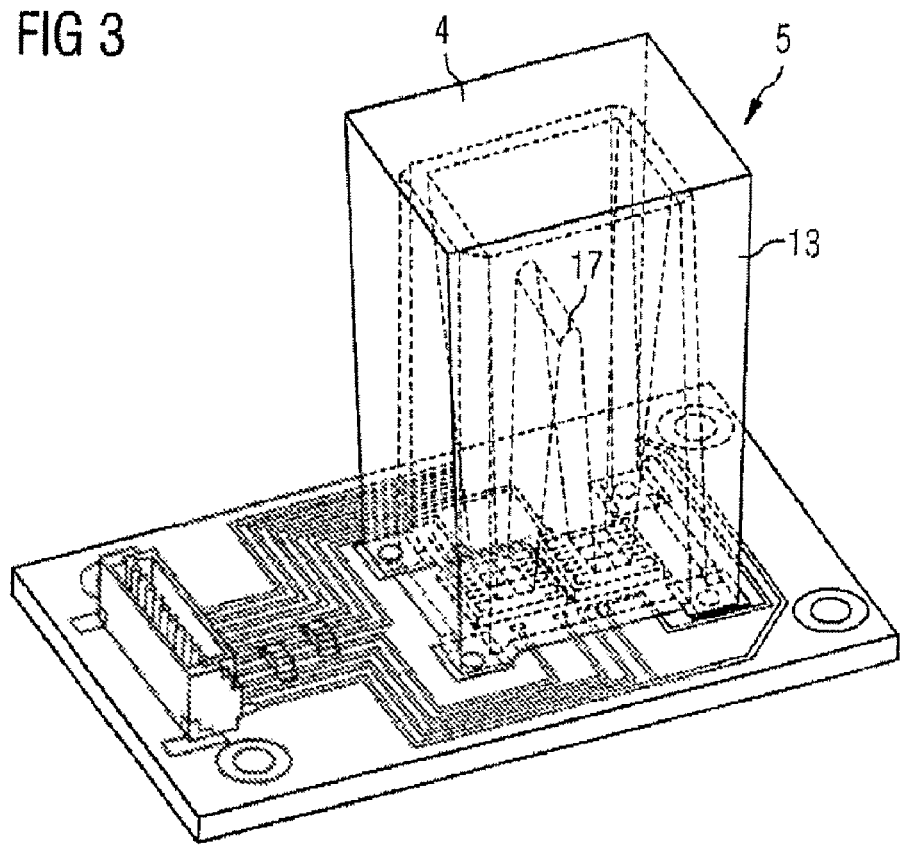
FIG. 3 is a schematic perspective sketch of a third exemplary embodiment of the here described light-emitting module.

FIG. 3 is a schematic perspective sketch of a third exemplary embodiment of the here described light-emitting module. In this exemplary embodiment, the optical element 5 is configured in one piece. Between the optic bodies 3, which are configured as truncated pyramids, there is a web 17 resulting from the production process. The web 17 is preferably selected to be particularly thin, so as to have as little effect as possible on the optical properties of the optical element 5. The width of the web 17 is preferably no more than 0.25 mm.

Figure 4A:
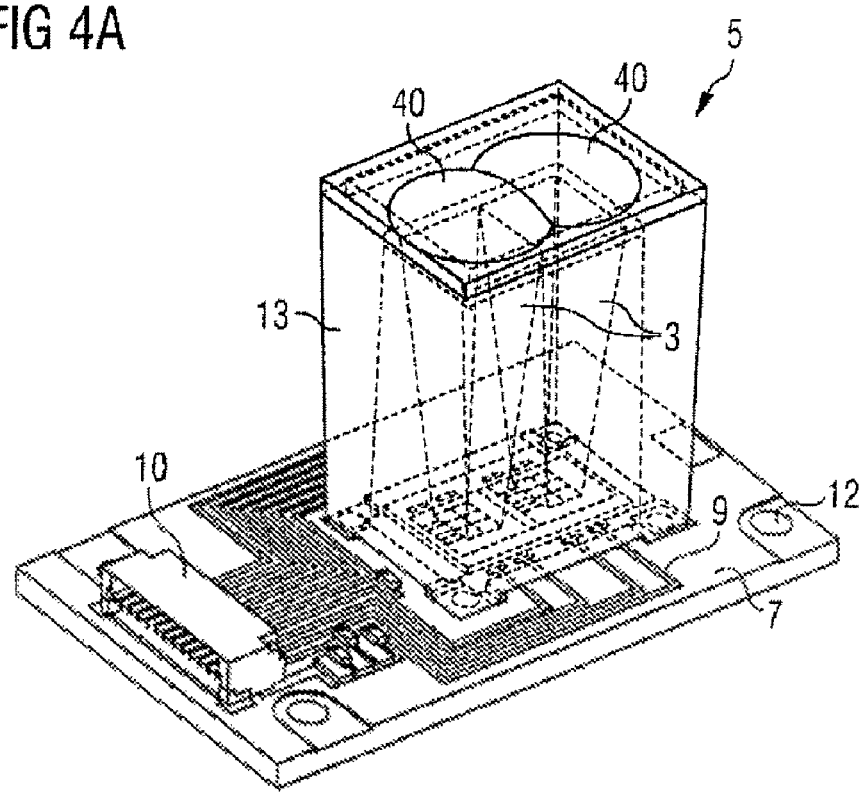
FIG. 4A is a schematic perspective sketch of a fourth exemplary embodiment of the here described light-emitting module.

FIG. 4A is a schematic perspective sketch of a fourth exemplary embodiment of the here described light-emitting module. FIGS. 4B and 4C are schematic perspective representations of the optic bodies 3 of this module. The optic bodies 3 are attached to a holder 13. Their light exit surfaces 40 complement one another to form the light exit surface 4 of the optical element 3. With this arrangement, it is possible for radiation coupled in at the light entrance surface 14 of the one optic body 3 to exit the module through the radiation exit surface 40 of the other optic body. The composite light exit surface 4 therefore constitutes a light exit surface for the module 20 as a whole.

In this exemplary embodiment, the optic bodies 3 of the optical element 5 comprise asymmetrical truncated pyramids 3a as optical concentrators. That is, a center axis that runs perpendicular to radiation entrance surface 14 through its geometric center does not coincide with a center axis passing through the geometric center of light exit surface 40. The light exit surface 4 of the optical element preferably serves in this case as a concentrator lens. Its off-center arrangement relative to the radiation entrance surface 14 of the optic body 3 helps to compensate for the asymmetry of the truncated pyramid 3a forming the optic body 3. The schematic sectional representation of the optical element 3 provided in FIG. 4D uses exemplary beams to illustrate how a decentralized lens-shaped light exit surface 40 can compensate for the asymmetry of the asymmetrical truncated pyramid 3a.

Figure 5:
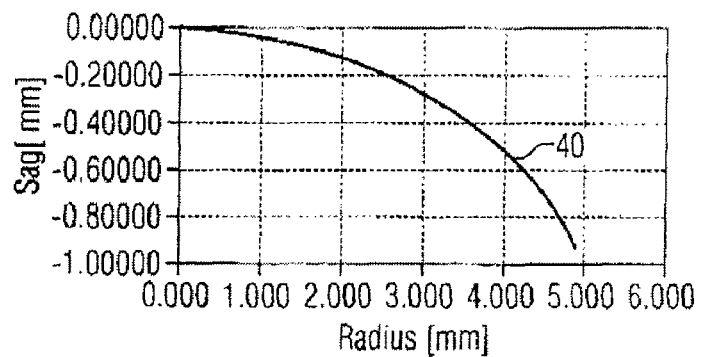
FIG. 5 shows the profile of an optimized light exit surface for an exemplary embodiment of the optical element.
Figure 6A:
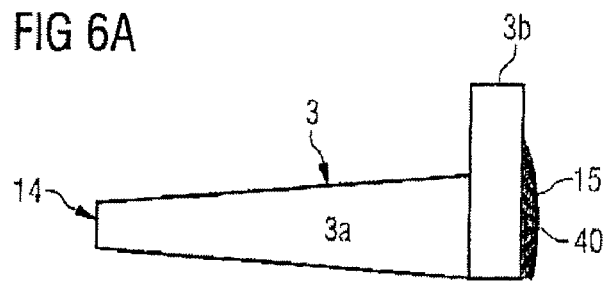
FIGS. 6A and 6B are schematic sectional representations of optic bodies for exemplary embodiments of the optical element.
Figure 6B:
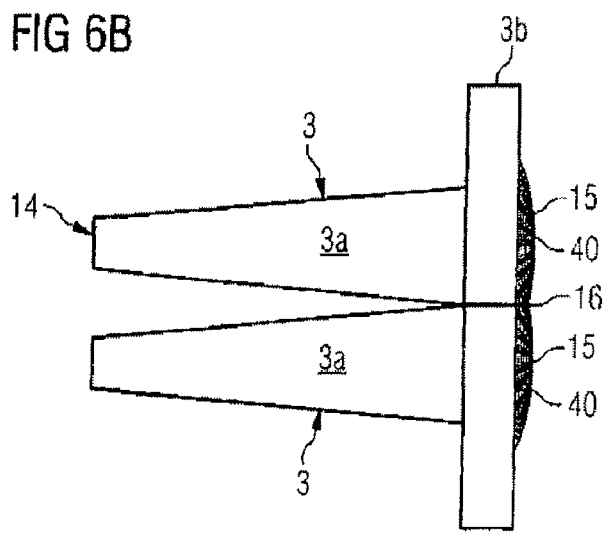

FIG. 5 shows an optimized profile of the radiation exit surface 40 for an optic body as illustrated, for example, in FIGS. 6A and 6B. FIG. 5 shows the profile of the radiation exit surface 40 from the center to the edge. FIG. 5 gives the sag in millimeters as a function of radius. The light exit surface 40 of the optic body 3 is, for example, optimized by a ray tracing method. To this end, Table 1 gives the coordinates of selected points on the radiation exit surface 40 of an optic body 3.

FIG. 6A is a schematic sectional representation of an optic body 3 having a radiation exit surface 40. The length of the truncated pyramid 3a in this case is about 18 mm, for example. The thickness of the cover plate 3b, which is disposed downstream of the truncated pyramid 3a and is preferably configured integrally therewith, is about 2.5 mm. The length of the optic body 3, from the radiation entrance surface 14 to the apex of the radiation exit surface 40, is about 22 mm. The radiation exit surface 40 of the optic body 3 as illustrated in FIG. 6A has a convex curvature 15. FIG. 6B is a schematic sectional representation of optic bodies 3 that are interconnected at their radiation exit surfaces 40. The radiation exit surfaces 40 of the optic bodies 3 complement each other to form the radiation exit surface 4 of an optical element 5. The radiation exit surface 4 of the optical element has convexly curved subregions 15 and concavely curved subregions 16.

FIGS. 7A, 7B and 7C are schematic sectional representations of optical elements 5, each of which is followed downstream by two light sources 1.

The optic bodies 3 of FIG. 7A have respective planar light exit surfaces 40 which together form a planar light exit surface 4 of an optical element 5.

FIG. 7B shows two optic bodies 3, each having a curved light exit surface 40. The light exit surfaces 40 of the optic bodies 3 complement each other to form a light exit surface 4 of the optical element 5, which is arched over both optic bodies 3 and extends dome-like over said optic bodies 3.

FIG. 7C shows two optic bodies 3 whose respective light exit surfaces 40 are curved in the manner of a lens. The light exit surface 4 of the optical element 5, which surface is composed of the light exit surfaces 40 of the optic bodies 3, has convex subregions 15 and a concave subregion 16 interconnecting the convex subregions 15. Where the optic bodies 3 are in contact, concave subregion 16 is formed by a trench tapering to a point and extending in the radiation exit surface 4 of the optical element 3.

The optical elements 5 of FIGS. 7A to 7B are preferably each implemented as two-part and are composed of the radiation entrance surfaces 40 of the optic bodies 3. The optic bodies 3 can be glued together and/or held together by means of a holder 13.

The radiation entrance surfaces 14 and the radiation exit surfaces 40 of the optic bodies 3 can additionally comprise coatings (not shown) or periodic microstructures ("moth-eye structures") suitable for dereflecting these light-passing surfaces. Particularly in coating the light entrance surfaces 14 of the optic bodies 3, care should be taken to ensure a particularly high heat resistance and heat exchange resistance due to the proximity of the light sources, which generate heat during operation.

FIG. 8 is a schematic sectional representation of an exemplary embodiment of the here described optical projection apparatus. The optical projection apparatus comprises three light-emitting modules 20 of the kind described, for example, in the previous exemplary embodiments. One of the modules 20a is, for example, suitable for generating red light. Another module 20b may be suitable for generating blue light. The third module 20c may be suitable for generating green light. The modules 20a to 20c are disposed on the lateral faces of an X-cube 30, into which they can beam their light. Radiation 34 leaves the X-cube 30 according to which of the modules light up simultaneously. The radiation 34 strikes an array of individually drivable micromirrors 31 that serves as an imaging element. Alternatively, LCD panels can be disposed as imaging elements between the modules 20a to 20c and the X-cube. Some of the radiation 35 reflected by the micromirrors passes through a projection lens 32 and is projected from there onto a projection screen.

The invention is not limited by the description made with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. A light-emitting module, comprising at least two light sources disposed on a common carrier and at least two optic bodies, wherein
   at least one of said light sources includes at least two LED chips,
   each said light source is followed downstream by one of said optic bodies of an optical element,
   said optic bodies are suitable for guiding electromagnetic radiation to a single light exit surface of said optical element,
   said optical element comprises said at least two optic bodies, each optic body comprising a light exit surface,
   said optical element has said single light exit surface which is composed of the light exit surfaces of the optic bodies, and
   said light exit surface of said optical element has convex subregions that are interconnected by concave subregions.

2. The light-emitting module as in claim 1, wherein at least one of said optic bodies includes a non-imaging optical concentrator.

3. The light-emitting module as in claim 1, wherein at least one of said optic bodies includes a truncated-pyramid optic.

4. The light-emitting module as in claim 1, wherein at least one of said optic bodies includes an asymmetrical truncated-pyramid optic.

5. The light-emitting module as in claim 1, wherein at least one of said optic bodies is configured as a solid body.

6. The light-emitting module as in claim 1, wherein said optical element is configured in more than one piece.

7. The light-emitting module as in claim 1, wherein said optical element is one-piece.

8. The light-emitting module as in claim 1, wherein a light entrance surface of at least one of said optic bodies has an anti-reflection coating comprising a dielectric material.

9. The light-emitting module as in claim 1, wherein said light entrance surface of at least one of said optic bodies has a periodic microstructure suitable for reducing the reflection of electromagnetic radiation.

10. The light-emitting module as in claim 1, wherein said light exit surface of said optical element has an anti-reflection coating comprising a dielectric material.

11. The light-emitting module as in claim 1, wherein said light exit surface of said optical element has a periodic microstructure suitable for reducing the reflection of electromagnetic radiation.

12. The light-emitting module as in claim 1, wherein at least one said LED chip is unencapsulated.

13. The light-emitting module as in claim 1, wherein a gap containing air is disposed between a light outcoupling surface of at least one said LED chip and a said light entrance surface of a said optic body.

14. The light-emitting module as in claim 1, wherein the distance between said light outcoupling surface of said at least one LED chip and said light entrance surface of a said optic body is no more than 250 μm.

15. The light-emitting module as in claim 1, comprising a holder to which said optic bodies are attached.

16. The light-emitting module as in claim 15, wherein said optic bodies are integrally connected to said holder.

17. The light-emitting module as in claim 15, wherein said holder surrounds said optic bodies on at least four sides.

18. The light-emitting module as in claim 15, wherein said holder surrounds said light sources on at least four sides.

19. An optical projection apparatus comprising a light-emitting module according to claim 1 and a projection optic that is disposed downstream of said light-emitting module.

* * * * *

UNITED STATES PATENT AND TRADEMARK OFFICE
CERTIFICATE OF CORRECTION

PATENT NO. : 7,976,205 B2  Page 1 of 1
APPLICATION NO. : 12/065017
DATED : July 12, 2011
INVENTOR(S) : Stefan Grötsch It is certified that error appears in the above-identified patent and that said Letters Patent is hereby corrected as shown below:

Title Page, Item (75):

Inventors:

Delete "Sergey Kudaev, Jena (RU)" and insert --Sergey Kudaev, Jena (DE)--

Signed and Sealed this
Eighteenth Day of October, 2011

David J. Kappos
*Director of the United States Patent and Trademark Office*